United States Patent
Kreupl et al.

(10) Patent No.: US 8,216,862 B2
(45) Date of Patent: Jul. 10, 2012

(54) FORMING AND TRAINING PROCESSES FOR RESISTANCE-CHANGE MEMORY CELL

(75) Inventors: Franz Kreupl, Mountain View, CA (US); Deepak C. Sekar, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 201 days.

(21) Appl. No.: 12/842,810

(22) Filed: Jul. 23, 2010

(65) Prior Publication Data

US 2011/0229990 A1    Sep. 22, 2011

Related U.S. Application Data

(60) Provisional application No. 61/314,564, filed on Mar. 16, 2010.

(51) Int. Cl.
*H01L 21/06* (2006.01)
(52) U.S. Cl. .......... 438/17; 438/95; 438/102; 438/103; 438/104; 257/E21.068
(58) Field of Classification Search ............ 438/17, 438/95, 102, 103, 104; 257/E21.068
See application file for complete search history.

(56) References Cited

U.S. PATENT DOCUMENTS

| | | |
|---|---|---|
| 2004/0114317 A1 | 6/2004 | Chiang et al. |
| 2008/0144356 A1 | 6/2008 | Oh et al. |
| 2008/0278988 A1 | 11/2008 | Ufert |
| 2009/0026434 A1 | 1/2009 | Malhotra et al. |
| 2009/0108247 A1 | 4/2009 | Takaura et al. |
| 2009/0147558 A1 | 6/2009 | Tamai et al. |
| 2009/0230377 A1 | 9/2009 | Schrott et al. |
| 2009/0258489 A1 | 10/2009 | Chen et al. |
| 2009/0272962 A1 | 11/2009 | Kumar et al. |
| 2009/0302296 A1 | 12/2009 | Fuchigami et al. |
| 2010/0096610 A1 | 4/2010 | Wang et al. |
| 2010/0172170 A1* | 7/2010 | Tamai et al. .............. 365/148 |

OTHER PUBLICATIONS

Wu et al., "Highly Stable SrZrO3 Bipolar Resistive Switching Memory by Ti Modulation Layer", 217th ECS Meeting, Abstract #1018, The Electrochemical Society, MA2010-01, Apr. 25-30, 2010, Vancouver, Canada.

* cited by examiner

*Primary Examiner* — Thanh V Pham
(74) *Attorney, Agent, or Firm* — Vierra Magen Marcus & DeNiro LLP

(57) ABSTRACT

During the manufacture of a set of non-volatile resistance-switching memory elements, a forming process is performed in which a voltage is applied over forming period until a conductive filament is formed in a resistance-switching layer. A heat source at a temperature of 50° C. to 150° C. is applied to expedite the forming process while reducing the required magnitude of the applied voltage. Manufacturing time and reliability are improved. After the forming process, an expedited training process can be performed in which a fixed number of cycles of voltage pulses are applied without verifying the memory elements. Subsequently, the memory elements are verified by determining their read current in an evaluation. Another fixed number of cycles of voltage pulses is applied without verifying the memory elements, if the memory elements do not pass the evaluation.

20 Claims, 9 Drawing Sheets

FORMING AND TRAINING PROCESSES FOR RESISTANCE-CHANGE MEMORY CELL

CROSS-REFERENCE TO RELATED APPLICATIONS

This application claims the benefit of U.S. provisional patent application No. 61/314,564, filed Mar. 16, 2010, titled "Non-volatile storage with metal oxide switching element," to Franz Kreupl et al., (docket no.: SAND-01459U50), incorporated herein by reference.

BACKGROUND

The present invention relates to technology for data storage.

A variety of materials show reversible resistance-change behavior. These materials include chalcogenides, carbon polymers, perovskites, and certain metal oxides (MeOx) and nitrides. Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN), as described by Pagnia and Sotnick in "Bistable Switching in Electroformed Metal-Insulator-Metal Device," Phys. Stat. Sol. (A) 108, 11-65 (1988). A resistance-changing layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-change material to a stable low-resistance state. This conversion can be repeated many times. For some materials, the initial state is high-resistance rather than low-resistance. A set process may refer to switching the material from high to low resistance, while a reset process may refer to switching the material from low to high resistance.

These reversible resistance-change materials are of interest for use in nonvolatile memory arrays. One resistance state may correspond to a data "0," for example, while the other resistance state corresponds to a data "1." Some of these materials may have more than two stable resistance states.

Non-volatile memories that have storage elements or cells formed from reversible resistance-change material are known. For example, U.S. Patent Application Publication 2006/0250836, incorporated herein by reference, describes a rewriteable non-volatile memory cell that includes a diode coupled in series with a reversible resistance-change material such as a metal oxide or metal nitride.

There is a continuing need to expedite the manufacturing process and improve reliability in these and other memory devices.

DETAILED DESCRIPTION

In a set of reversible resistance-switching memory elements, the manufacturing process is expedited and reliability is improved for both a forming process and a subsequent training process.

In the forming process, a heat source at an elevated temperature such as 50° C. to 150° C. is applied to expedite the forming process while reducing the required magnitude of the applied voltage. In the training process, a fixed number of cycles of voltage pulses is applied without verifying the memory elements, in a first pass. Each cycle includes a set pulse and a reset pulse. Subsequently, the memory elements are evaluated to verify their switching behavior by applying a set of set and reset pulses followed by performing a verify operation to determining if the memory elements were successfully set or reset, respectively. If the memory elements do not pass the evaluation, another fixed number of cycles of voltage pulses is applied without verifying the memory elements, in a second pass. The memory elements are then evaluated again. In one approach, a different number of cycles is used in the second pass, and the voltage levels can differ as well in the second pass. The training process can be extended to additional passes until the memory elements pass the evaluation. The training process is expedited since verify operations are not performed after every cycle, where it is likely that the set of memory elements is not well-behaved until a substantial number of cycles of voltage pulses have been applied.

The resistance-switching memory elements may be provided in a memory device which is described below.

Figure 1:
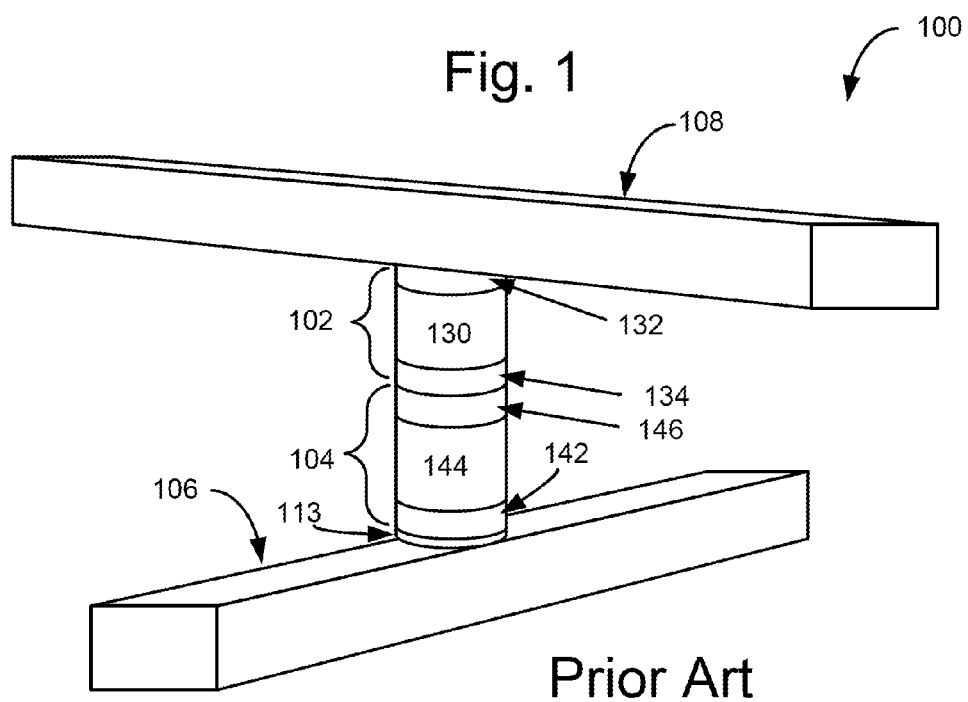
FIG. 1 is a simplified perspective view of one embodiment of a memory cell with a reversible resistance-switching element.

FIG. 1 is a simplified perspective view of one embodiment of a memory cell 100 which includes a resistance-switching memory element 102 coupled in series with a steering element 104 between a first conductor 106 and a second conductor 108.

Resistance-switching memory element 102 includes a resistance-switching material or layer 130 having a resistivity that may be reversibly switched between two or more states. For example, the reversible resistance-switching material may be in an initial high-resistivity state upon fabrication that is switchable to a low-resistivity state upon application of a first voltage and/or current. Application of a second voltage and/or current may return the reversible resistance-switching material to the high-resistivity state. Alternatively, the resistance-switching memory element may be in an initial low-resistance state upon fabrication that is reversibly switchable to a high-resistance state upon application of the appropriate voltage(s) and/or current(s). When used in a memory cell, one resistance state may represent a binary "0" while another resistance state may represent a binary "1." However, more than two data/resistance states may be used. Numerous reversible resistance-switching materials and operation of memory cells employing reversible resistance-switching materials are described, for example, in the above-mentioned U.S. Patent Application Publication 2006/0250836.

In one embodiment, the process of switching the resistance from the high-resistivity state to the low-resistivity state is referred to as setting the resistance-switching memory element 102. The process of switching the resistance from the low-resistivity state to the high-resistivity state is referred to as resetting the resistance-switching memory element 102. The high-resistivity state is associated with binary data "0" and the low-resistivity state is associated with binary data "1." In other embodiments, setting and resetting and/or the data encoding can be reversed. The set or reset process can be performed for a memory cell to program it to a desired state to represent binary data.

In some embodiments, reversible resistance-switching material 130 may be formed from a metal oxide. Various different metal oxides can be used. In one example, hafnium oxide (HfO$_2$) is be used.

More information about fabricating a memory cell using reversible resistance-switching material can be found in US 2009/0001343, published Jan. 1, 2009, titled "Memory Cell That Employs a Selectively Deposited Reversible Resistance Switching Element and Methods of Forming The Same," and incorporated herein by reference in its entirety.

Resistance-switching memory element 102 includes electrodes 132 and 134. Electrode 132 is positioned between a reversible resistance-switching material 130 (such as metal oxide) and conductor 108. In one embodiment, electrode 132 is made of titanium (Ti). Electrode 134 is positioned between metal oxide reversible resistance-switching material 130 and diode 104. In one embodiment, electrode 134 is made of Titanium Nitride (TiN), and serves as a barrier layer.

Steering element 104 can be a diode, or other suitable steering element that exhibits non-ohmic conduction by selectively limiting the voltage across and/or the current flow through the resistance-switching memory element 102. In this manner, the memory cell 100 may be used as part of a two or three dimensional memory array and data may be written to and/or read from the memory cell 100 without affecting the state of other memory cells in the array. Diode 104 may include any suitable diode such as a vertical polycrystalline p-n or p-i-n diode, whether upward pointing with an n-region above a p-region of the diode or downward pointing with a p-region above an n-region of the diode. Or, even a punch-through diode, which is operable in both directions, can be used.

In some embodiments, diode 104 may be formed from a polycrystalline semiconductor material such as polysilicon, a polycrystalline silicon-germanium alloy, polygermanium or any other suitable material. For example, the diode 104 may include a heavily doped n+ polysilicon region 142, a lightly doped or an intrinsic (unintentionally doped) polysilicon region 144 above the n+ polysilicon region 142, and a heavily doped p+ polysilicon region 146 above the intrinsic region 144. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 142 to prevent and/or reduce dopant migration from the n+ polysilicon region 142 into the intrinsic region 144, as described, for example, in U.S. Patent Application Publication No. 2006/0087005, incorporated herein by reference. It will be understood that the locations of the n+ and p+ regions may be reversed.

When diode 104 is fabricated from deposited silicon (e.g., amorphous or polycrystalline), a silicide layer may be formed on the diode to place the deposited silicon in a low resistivity state, as fabricated. Such a low resistivity state allows for easier programming of the memory cell as a large voltage is not required to switch the deposited silicon to a low resistivity state.

As described in U.S. Pat. No. 7,176,064, "Memory Cell Comprising a Semiconductor Junction Diode Crystallized Adjacent to a Silicide," incorporated herein by reference, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistivity silicon thereby is provided. Similar results may be achieved for silicon-germanium alloy and/or germanium diodes.

Conductors 106 and 108 include any suitable conductive material such as tungsten, any appropriate metal, heavily doped semiconductor material, a conductive silicide, a conductive silicide-germanide, a conductive germanide, or the like. In the embodiment of FIG. 1, conductors 106 and 108 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 106 and 108 to improve device performance and/or aid in device fabrication.

While the resistance-switching memory element 102 is shown as being positioned above the steering element 104 in FIG. 1, it will be understood that in alternative embodiments, the resistance-switching memory element 102 may be positioned below the steering element 104.

Figure 2A:
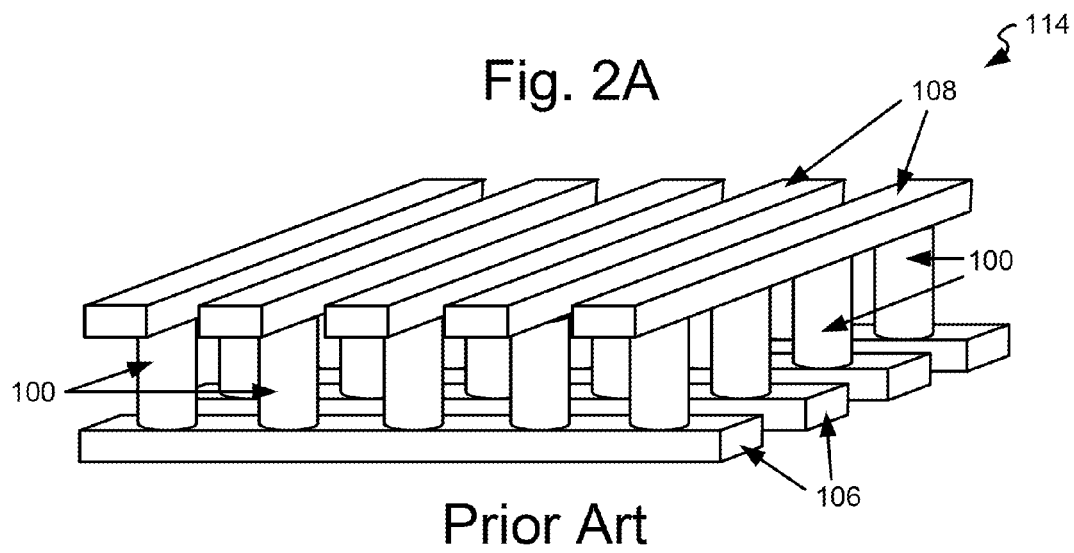
FIG. 2A is a simplified perspective view of a portion of a first memory level formed from a plurality of the memory cells of FIG. 1.

FIG. 2A is a simplified perspective view of a portion of a first memory level 114 formed from a plurality of the memory cells 100 of FIG. 1. For simplicity, the resistance-switching memory element 102, the diode 104, and barrier layer 113 are not separately shown. The memory array 114 is a "cross-point" array including a plurality of bit lines (second conductors 108) and word lines (first conductors 106) to which multiple memory cells are coupled (as shown). Other memory array configurations may be used, as may multiple levels of memory.

Figure 2B:
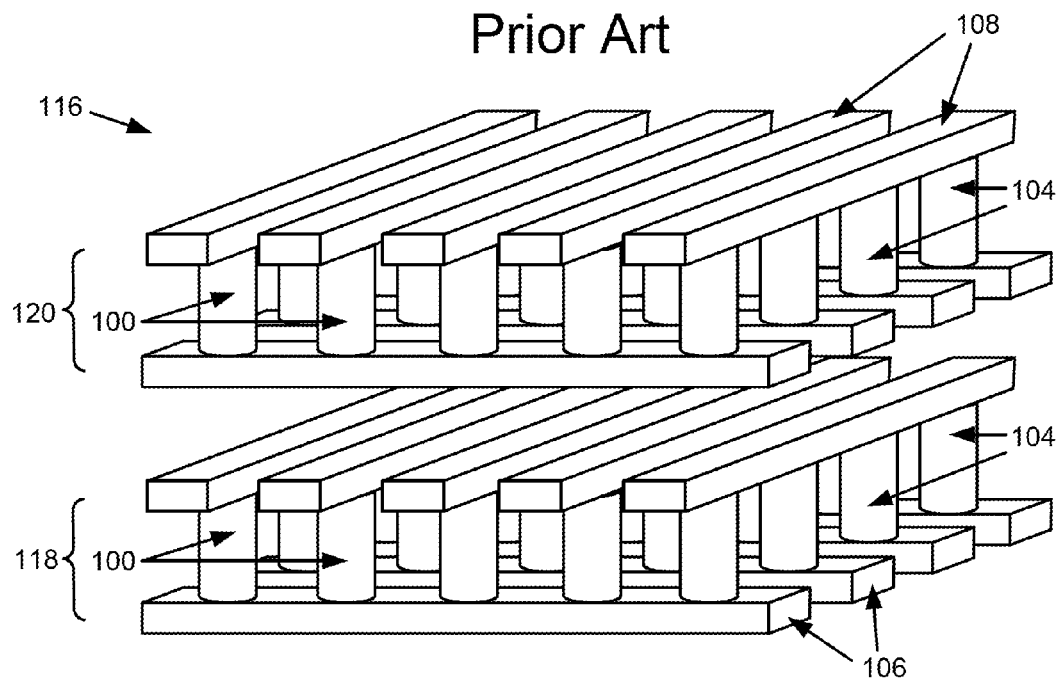
FIG. 2B is a simplified perspective view of a portion of a three dimensional memory array formed from a plurality of the memory cells of FIG. 1.
Figure 3:
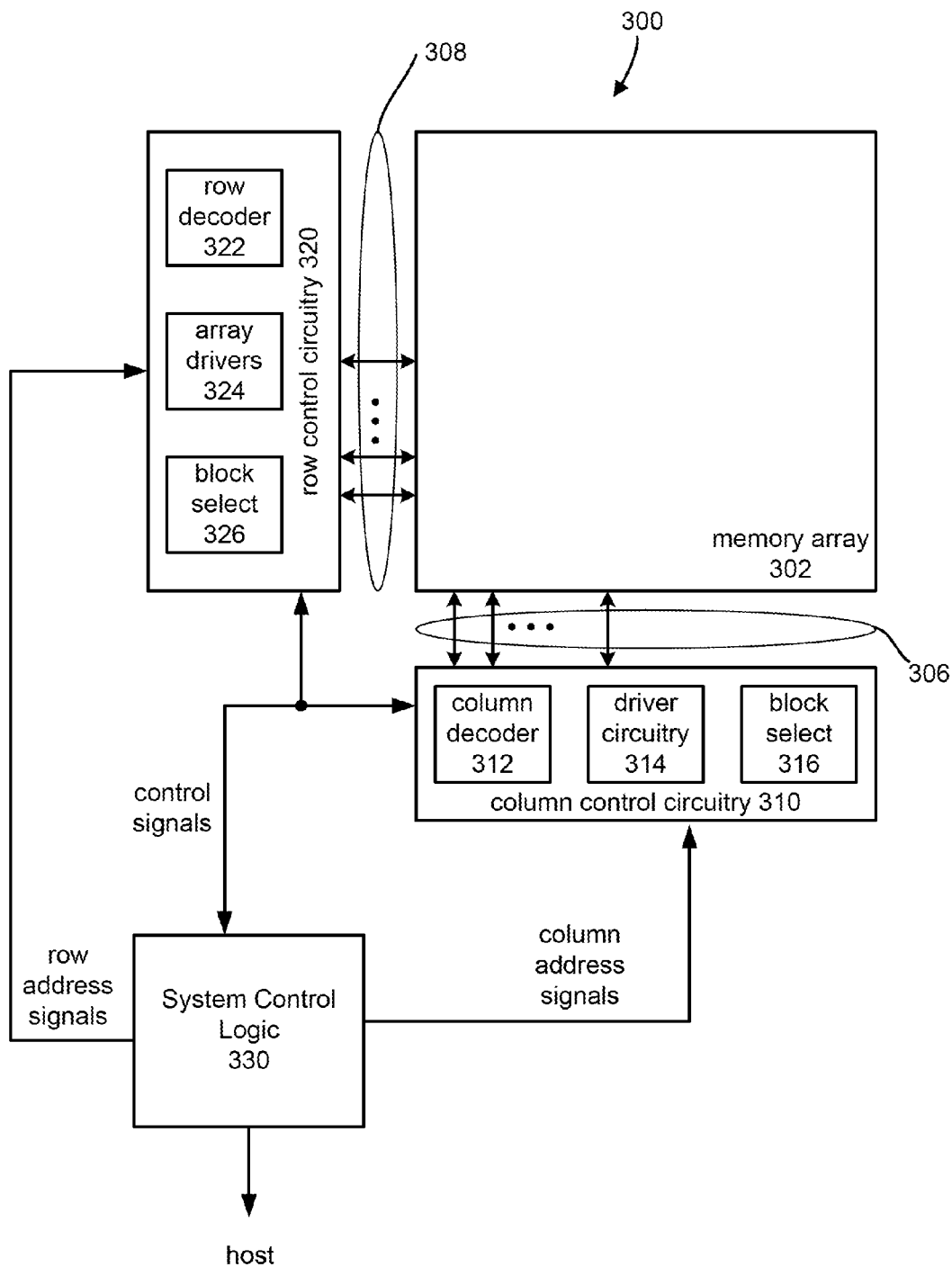
FIG. 3 is a block diagram of one embodiment of a memory system.

FIG. 2B is a simplified perspective view of a portion of a monolithic three dimensional array 116 that includes a first memory level 118 positioned below a second memory level 120. In the embodiment of FIG. 3, each memory level 118 and 120 includes a plurality of memory cells 100 in a cross-point array. It will be understood that additional layers (e.g., an inter-level dielectric) may be present between the first and second memory levels 118 and 120, but are not shown in FIG. 2B for simplicity. Other memory array configurations may be used, as may additional levels of memory. In the embodiment of FIG. 2B, all diodes may "point" in the same direction, such as upward or downward depending on whether p-i-n diodes having a p-doped region on the bottom or top of the diode are employed, simplifying diode fabrication.

Figure 2C:
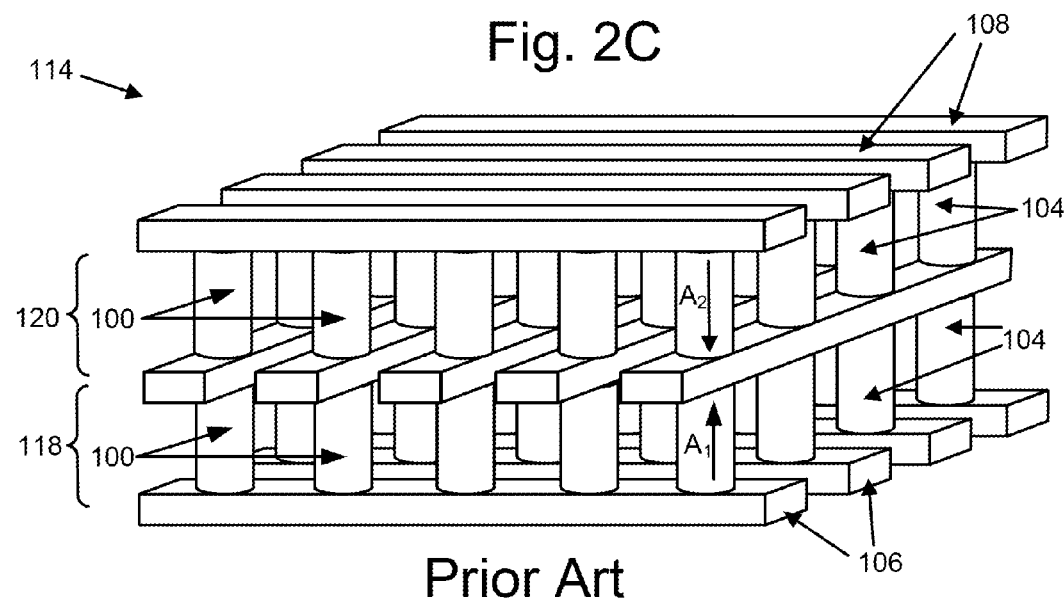
FIG. 2C is a simplified perspective view of a portion of a three dimensional memory array formed from a plurality of the memory cells of FIG. 1.

In some embodiments, the memory levels may be formed as described in U.S. Pat. No. 6,952,030, "High-Density Three-Dimensional Memory Cell," incorporated herein by reference. For instance, the upper conductors of a first memory level may be used as the lower conductors of a second memory level that is positioned above the first memory level as shown in FIG. 2C. In such embodiments, the diodes on adjacent memory levels preferably point in opposite directions, as described in U.S. Pat. No. 7,586,773, titled "Large Array Of Upward Pointing P-I-N Diodes Having Large And Uniform Current," incorporated herein by reference. For example, the diodes of the first memory level 118 may be upward pointing diodes as indicated by arrow A1 (e.g., with p regions at the bottom of the diodes), while the diodes of the second memory level 120 may be downward pointing diodes as indicated by arrow A2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory," incorporated herein by reference The substrates may be thinned or removed from the memory levels before bonding, but as the memory levels are initially formed over separate substrates, such memories are not true monolithic three dimensional memory arrays.

The above examples show memory cells in a cylindrical shape and conductors in the shapes of rails according to the disclosed arrangements. However, the technology described herein is not limited to any one specific structure for a memory cell. Other structures can also be used to form memory cells that include reversible resistance-switching material. For example, the following patents provide examples of structures of memory cells that can be adapted to use reversible resistance-switching material: U.S. Pat. Nos. 6,952,043; 6,951,780; 6,034,882; 6,420,215; 6,525,953; and 7,081,377, each of which is incorporated herein by reference. Additionally, other types of memory cells can also be used with the technologies described herein.

FIG. 3 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic circuit 330, and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. Column control circuitry 306 receives a group of N column address signals and one or more various control signals from system control logic 330, and typically may include such circuits as column decoders 312, array terminal receivers or drivers 314, block select circuitry 316, as well as read/write circuitry, including sense amps 318, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300. For example, write circuitry 460, read circuitry 461 and clamp control circuitry 464, discussed further below, may be provided.

In one embodiment, all of the components depicted in FIG. 3 are arranged on a single integrated circuit. For example, system control logic 330, column control circuitry 310 and row control circuitry 320 can be formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, resistance-switching memory element 102 may be reversibly switched between two or more states. For example, the reversible resistance-switching material may be in an initial, high-resistivity state upon fabrication that is switchable to a low-resistivity state upon application of a first voltage and/or current. Application of a second voltage and/or current may return the reversible resistance-switching material to a high-resistivity state.

Figure 5A:
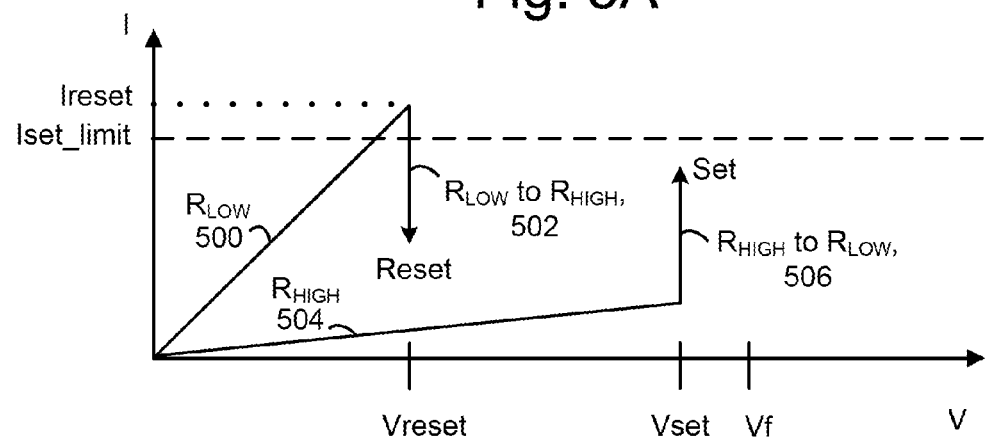
FIG. 5A is a graph depicting I-V characteristics of an example resistance-switching memory element.

FIG. 5A is a graph of voltage versus current for one example embodiment of a reversible resistance-switching element. Line 504 represents the I-V characteristics of the resistance-switching memory element when in the high-resistivity state ($R_{HIGH}$), and line 506 represents a transition to a low resistivity state at Vreset. Line 500 represents the I-V characteristics of the resistance-switching memory element when in the low-resistivity state ($R_{LOW}$), and line 502 represents a transition to a high resistivity state at Vset. The example shows an unipolar operation mode where the polarity of the voltage is not changed during switching. In general, the voltages may have different polarities for the "set" and "reset" operation.

To determine which state the resistance-switching memory element is in, a voltage is applied and the resulting current is measured. A higher measured current indicates that the resistance-switching memory element is in the low-resistivity state, while a lower measured current indicates that the resistance-switching memory element is in the high-resistivity state. Note that other variations of a resistance-switching memory element having different I-V characteristics can also be used with the technology herein.

Figure 5B:
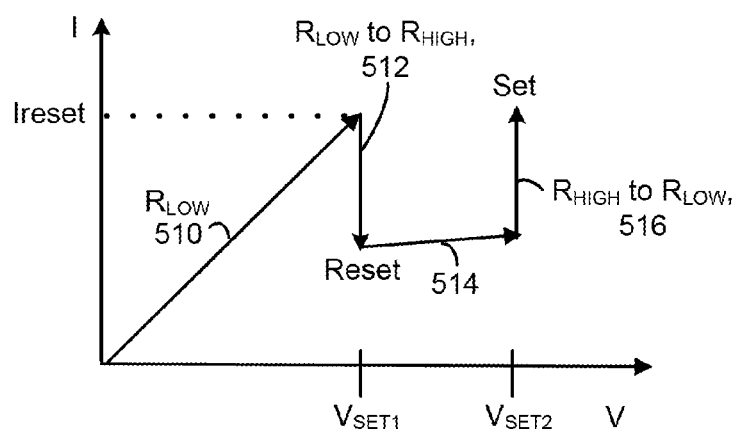
FIG. 5B is a graph depicting I-V characteristics of another example reversible resistance-switching element.

For example, FIG. 5B is a graph depicting I-V characteristics of another example reversible resistance-switching element. In this case, the element follows a path 510 in a low-resistivity state ($R_{LOW}$), then switches in path 512 to a high resistivity state at a voltage Vset1. As the voltage is increased further, the element follows a path 514 in the high-resistivity state ($R_{HIGH}$), then switches in path 516 to back to the low resistivity state at a voltage Vset2.

Figure 4:
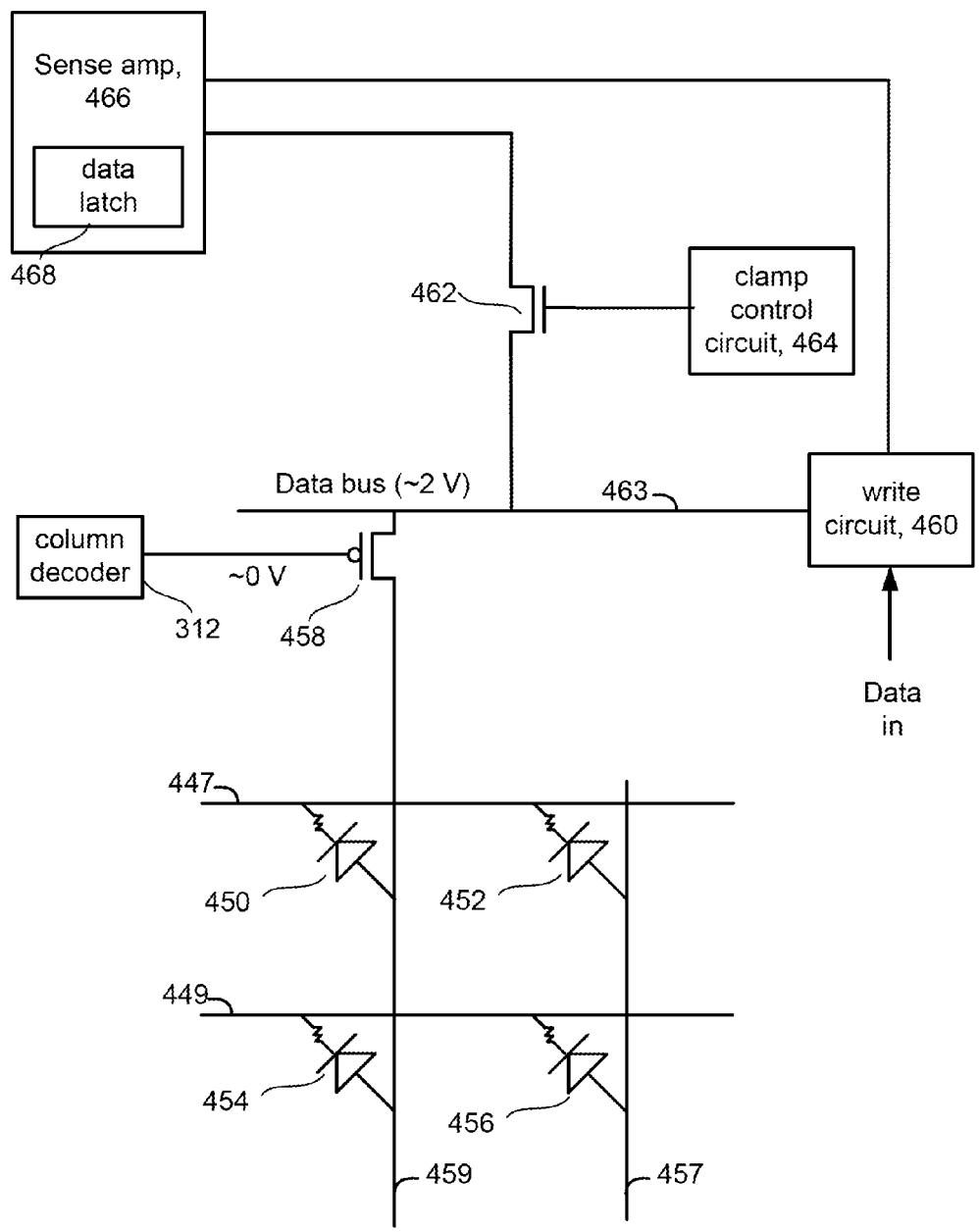
FIG. 4 depicts a circuit for reading the state of a memory cell.

FIG. 4 depicts a circuit that illustrates one embodiment for reading the state of a memory cell. A portion of a memory array includes memory cells 450, 452, 454 and 456. Two of the many bit lines and two of the many word lines are depicted. Bit line 459 is coupled to cells 450 and 454, and bit line 457 is coupled to cells 452 and 456. Bit line 459 is the selected bit line and may be at 2 V, for instance. Bit line 457 is an unselected bit line and may be at ground, for instance. Word line 447 is the selected word line and may be at 0 V, for instance. Word line 449 is an unselected word line and may be at 2 V, for instance.

A read circuit for one of the bit lines 459 is depicted to be connected to the bit line via transistor 458, which is controlled by a gate voltage supplied by column decoder 312 in order to select or unselect the corresponding bit line. Transistor 458 connects the bit line to a Data bus 463. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to a sense amp 466, which includes a data latch 468. The output of sense amp 466 is connected to a data out terminal (to system control logic 330, a controller and/or a host). Write circuit 460 is also connected to the sense amp 466 and the data latch 468.

When attempting to read the state of the reversible resistance-switching element, all word lines are first biased at $V_{READ}$ (e.g., approximately 2 V) and all bit lines are at ground. The selected word line is then pulled to ground. For example, this discussion will assume that memory cell 450 is selected for reading. One or more selected bit lines 459 are pulled to $V_{READ}$ through the data bus (by turning on transistor 458) and the clamp device (transistor 462, which receives ~2 V+$V_{TH}$, the threshold voltage of the transistor 462). The clamp device's gate is above $V_{READ}$ but controlled to keep the bit line near $V_{READ}$. In one approach, current is pulled by the selected memory cell 450 through transistor 462 from a sense node in the sense amp. The sense node can receive a reference current that is between a high-resistivity state current and a low-resistivity state current. The sense node moves corresponding to the current difference between the cell current and the reference current. Sense amp 466 generates a data out signal by comparing the sensed voltage to a reference read voltage. If the memory cell current is larger than the reference current, the memory cell is in the low-resistivity state and the voltage at the sense node will be lower than the reference voltage. If the memory cell current is smaller than the reference current, the memory cell is in the high-resistivity state and the voltage at the sense node will be higher than the reference voltage. The output data signal from the sense amp 466 is latched in data latch 468.

Looking back at FIG. 5A, while in the high-resistivity state, if the voltage $V_{SET}$ and sufficient current is applied, the resistance-switching memory element will be set to the low-resistivity state. Line 504 shows the behavior when $V_{SET}$ is applied. The voltage will remain somewhat constant and the current will increase toward $I_{SET\_LIMIT}$. At some point, the resistance-switching memory element will be set and the device behavior will be based on line 506. Note that the first time the resistance-switching memory element is set, Vf (the forming voltage) is needed to set the device. After that, $V_{SET}$ is sufficient to set the device be used. The forming voltage Vf may be greater than $V_{SET}$.

While in the low-resistivity state (line 500), if the voltage $V_{RESET}$ and sufficient current ($I_{RESET}$) are applied, the resistance-switching memory element will be reset to the high-resistivity state. Line 500 shows the behavior when $V_{RESET}$ is applied. At some point, the resistance-switching memory element will be reset and the device behavior will be based on line 502.

In one embodiment, $V_{SET}$ is approximately 5 V, $V_{RESET}$ is approximately 3 V, $I_{SET\_LIMIT}$ is approximately 5 µA and $I_{RESET}$ could be as high as 30 µA.

Figure 6A:
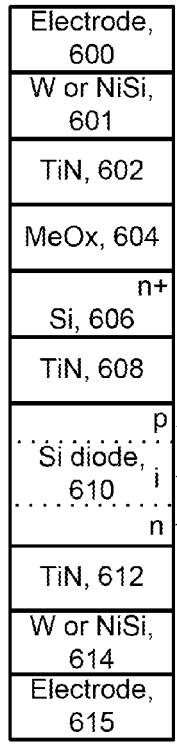
FIG. 6A depicts an example implementation of a layered memory device.

FIG. 6A depicts an example implementation of a layered memory device. The implementation includes a number of layers, each fabricated over the previous layer, including a W or NiSi layer 614 connected to a word line, a TiN layer 612, an Si diode 610 having an n-type region 613, an intrinsic (i) region 611 and a p-type region 609, a TiN layer 608, an n+ type Si layer 606, a MeOx layer 604, a TiN layer 602 and a W or NiSi layer 601 connected to a bit line. A portion of the word line which contacts the bottom of the layered memory device is an electrode 615, and a portion of the word line which contacts the top of the layered memory device is an electrode 600. The metal oxide can be $HfO_x$, as an example. The Si diode 610 is a steering element which allows a voltage to be selectively applied by a control to the MeOx layer 604.

Figure 6B:
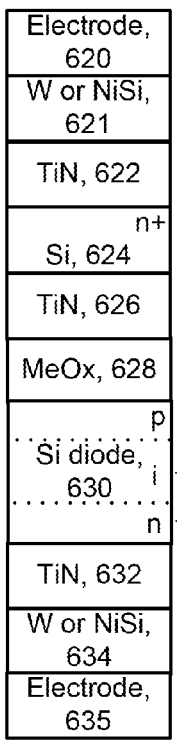
FIG. 6B depicts another example implementation of a layered memory device.

FIG. 6B depicts another example implementation of a layered memory device. The implementation includes a number of layers, each fabricated over the previous layer, including a W or NiSi layer 634 connected to a word line as represented by an electrode 635, a TiN layer 632, an Si diode 630 having an n-type region 633, an intrinsic (i) region 631 and a p-type region 629, a MeOx layer 628, a TiN layer 626, an n+ Si layer 624, a TiN layer 622 and a W or NiSi layer 621 connected to a bit line as represented by an electrode 620. In this case, the p-type region 629 of the Si diode contacts the MeOx layer 628, acting as an electrode.

Figure 6C:
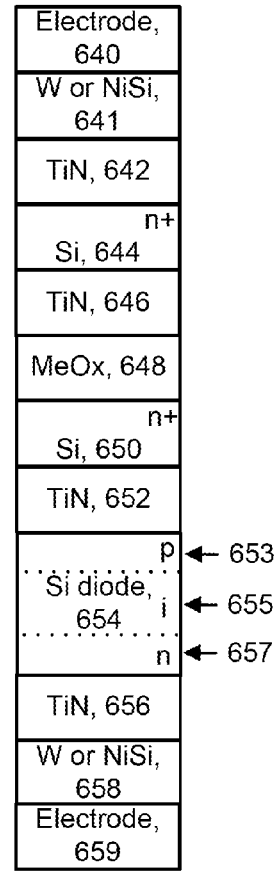
FIG. 6C depicts another example implementation of a layered memory device.

FIG. 6C depicts another example implementation of a layered memory device. The implementation includes a number of layers, each fabricated over the previous layer, including a W or NiSi layer 658 connected to a word line as represented by an electrode 659, a TiN layer 656, an Si diode 654 having an n-type region 657, an intrinsic (i) region 655 and a p-type region 653, a TiN layer 652, an n+ type Si layer 650, a MeOx layer 648, a TiN layer 646, another n+ Si layer 644, a TiN layer 642 and a W or NiSi layer 641 connected to a bit line as represented by an electrode 640.

Figure 6D:
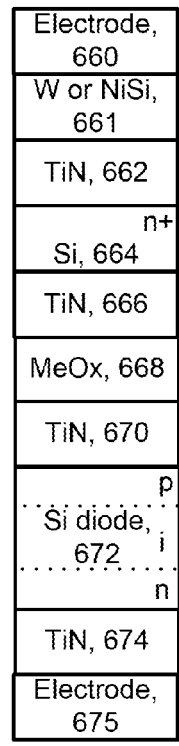
FIG. 6D depicts another example implementation of a layered memory device.

FIG. 6D depicts another example implementation of a layered memory device. The implementation includes a number of layers, each fabricated over the previous layer, including a TiN layer 674 connected to a word line as represented by an electrode 675, an Si diode 672 having an n-type region 675, an intrinsic (i) region 673 and a p-type region 671, a TiN layer 670, a MeOx layer 668, a TiN layer 666, an n+ Si layer 664, a TiN layer 662 and a W or NiSi layer 661 connected to a bit line as represented by an electrode 660. Here, the TiN layers 666 and 670 are both adjacent to the MeOx layer 668, on opposing sides, and act as metal contacts to the MeOx layer 668.

Figure 6E:
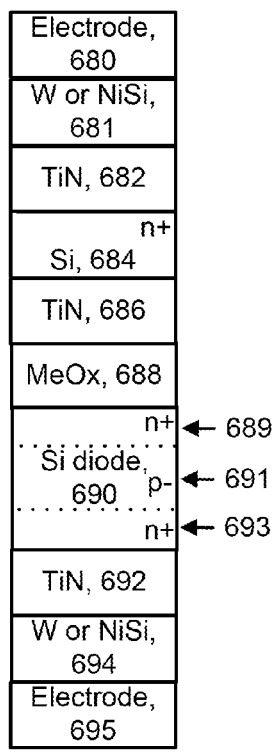
FIG. 6E depicts an example implementation of a layered memory device, where a punch-through diode is used as a steering element.

FIG. 6E depicts an example implementation of a layered memory device, where a punch-through diode is used as a steering element. The implementation is similar to that of FIG. 6B, except the Si diode 690 is a punch-through diode which includes an n+ region 693, p− region 691 and n+ region 689. The implementation includes a number of layers, each fabricated over the previous layer, including a W or NiSi layer 694 connected to a word line as represented by an electrode 695, a TiN layer 692, the Si diode 690, a MeOx layer 688, a TiN layer 686, an n+ Si layer 684, a TiN layer 682 and a W or NiSi layer 681 connected to a bit line as represented by an electrode 680.

A punch-through diode allows bipolar operation of a cross-point memory array, and may have a symmetrical non-linear current/voltage relationship. The punch-through diode has a high current at high bias for selected cells and a low leakage current at low bias for unselected cells. Therefore, it is compatible with bipolar switching in cross-point memory arrays having resistive switching elements. The punch-through diode may be a N+/P−/N+ device or a P+/N−/P+ device.

Generally, the punch-through diode 680 includes two regions 689 and 693 that are heavily-doped with a material having a first type of conductivity, e.g., n type. A region 691 is lightly-doped with a material having a second type of conductivity, e.g., p type. The punch-through diode 690 is a N+/P−/N+ device.

While example implementations involving a memory cell having a diode as a steering element are provided, the techniques provided herein are generally applicable to other devices and steering elements, including a transistor, a punch-through transistor, a punch-through diode, a PN diode, NP diode, a PIN diode, an NPN diode, PNP diode, a Schottky diode, an MIN diode, a carbon silicone diode, a transistor layout and so forth. An example of a punch-through diode was provided in FIG. 6E.

Variations of the above-mentioned implementations are possible. The order of layers in each implementation can be reversed so that the word line is on top and the bit line is on the bottom, for instance. Moreover, one or more intermediate layers can be provided between each of the layers depicted. Also, the order of the steering element can be changed so that it is located above the other layers.

Also, the resistance-changing element in the memory cell need not be a metal oxide. It can be a phase change cell, a carbon-based, a carbon nanotube-based, nano-ionic memory, conductive bridge, or a cell which changes its phase, spin, magnetic component, and so forth.

Figure 7:
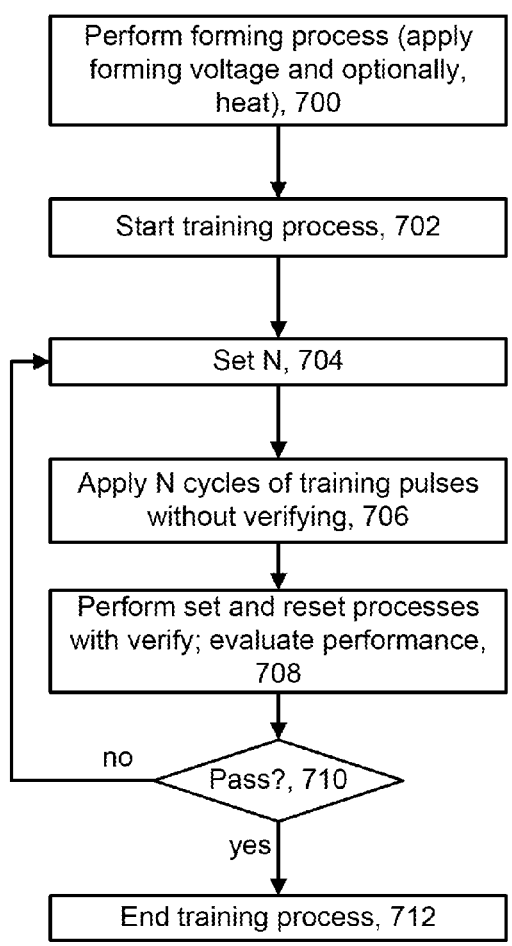
FIG. 7 depicts an example forming process followed by a training process for a set of non-volatile resistance-switching memory elements.

FIG. 7 depicts an example forming process followed by a training process for a set of non-volatile resistance-switching memory elements. Step 700 includes performing a forming process by applying a forming voltage to each resistance-switching memory element in a set of such elements. The forming process can be concurrent for all memory elements in a set of or serial for different subsets of the memory elements in the set. Optionally, heat is applied as well.

Figure 8A:
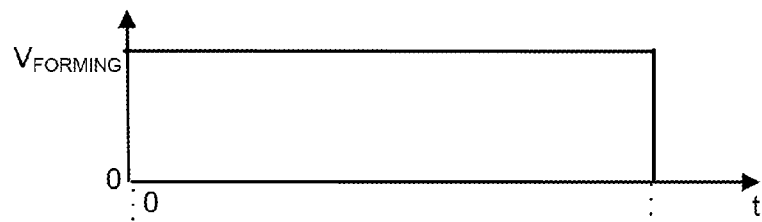
FIG. 8A depicts a forming voltage which is applied in a forming operation.
Figure 8B:
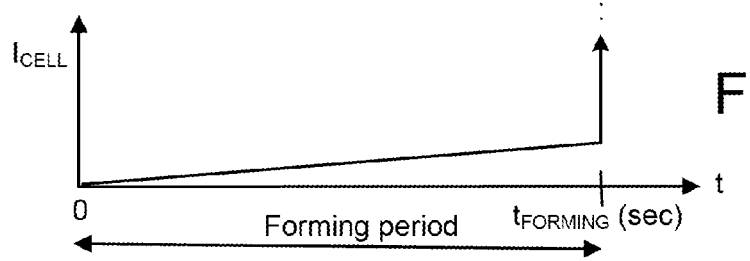
FIG. 8B depicts a cell current during a forming period.

For example, FIG. 8A depicts a forming voltage which is applied in a forming operation. Typically, a constant voltage ($V_{FORMING}$) is applied while monitoring the current in the memory element, until a specified current level is reached, indicating that forming has been completed, at which time the voltage is removed. Or, a non-constant voltage could be used, such as a gradually increasing voltage having the shape of a ramp. For example, the completion of the forming process for a memory element can be signaled by a sudden increase in the cell current, Icell, as depicted at a time $t_{FORMING}$ in FIG. 8B. FIG. 8B, which is time-aligned with FIG. 8A, depicts a cell current during a forming period. Generally, at least one forming voltage is applied which causes at least one non-volatile resistance-switching memory element to switch from a higher resistance state to a lower resistance state for a first time, that is, a first time in a lifetime of the memory element.

Figure 8C:
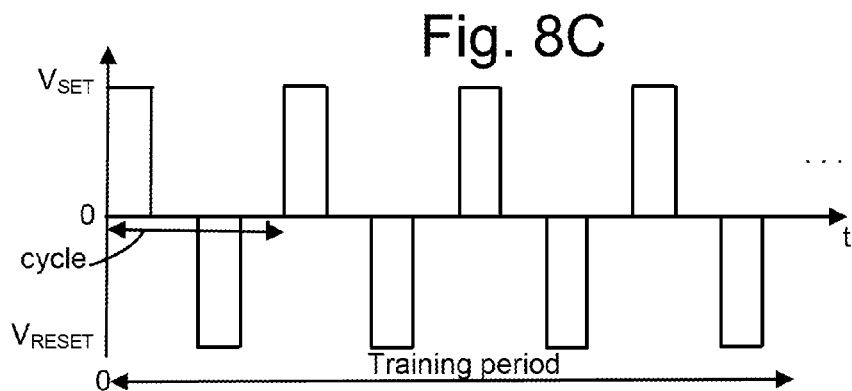
FIG. 8C depicts cycles of set and reset voltages applied to resistance-switching memory elements during a training period.

A training process is started at step 702 of FIG. 7. Generally, the training process can follow the forming process but is a separate procedure, and may involve a different location and/or equipment in a manufacturing operation compared to the forming process. At step 704, an integer value N is set, which is a number of cycles of training pulses to perform with performing a verify operation for a set of resistance-switching memory elements, in the current training pass. Typically, at least 10, 25, 50, 100 or more cycles can be set. The optimum number of cycles can be determined by experimentation. Step 706 includes applying the N cycles of training pulses without performing a verify operation for a set of resistance-switching memory elements. As an example, FIG. 8C depicts cycles of set and reset voltages applied to resistance-switching memory elements during a training period. Each cycle can include a set voltage having an amplitude of Vset>0 V, followed by a wait period in which the memory elements stabilize, followed by a reset voltage having an amplitude of Vreset<0 V, followed by another wait period. Each voltage pulse is a voltage applied across the electrodes of each memory element. As an example, Vset=6 V and Vreset=−7 V.

Figure 8D:
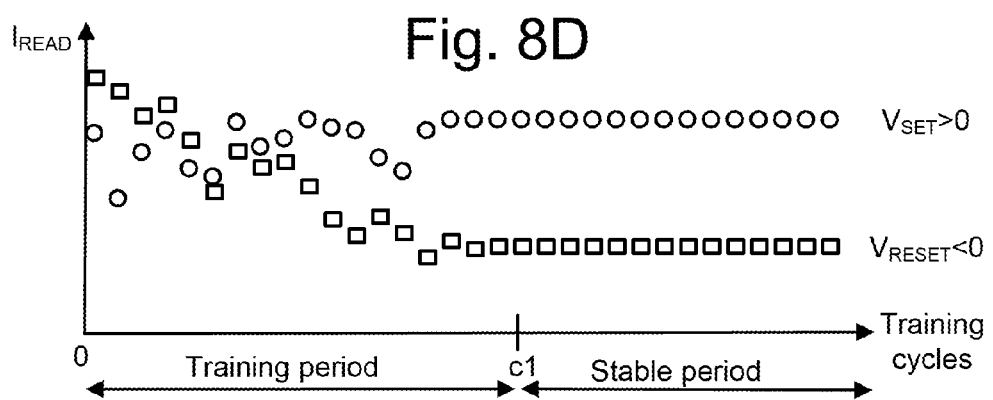
FIG. 8D depicts a read current of resistance-switching memory elements during a training period and a following stable period.

During the training period, the memory elements can act unpredictably such that their ability to pass current when a given voltage is applied is not stable or well-behaved, as indicated at FIG. 8D. FIG. 8D depicts a read current of resistance-switching memory elements during a training period and a following stable period. As an example, reading is performed by applying a low voltage such as 0.5 V to the memory elements. This reading is performed to provide the experimental data which is depicted. In practice, as mentioned, no verifying/reading occurs during the training period.

In a simplified example, each circle represents a data point for the read current, Iread, of a memory element, after a set voltage is applied. Recall that the set state is a low resistance state, so that Iread should be relatively high if the set state is achieved. As indicated, in a training period of c1 cycles, Iread can vary erratically from pulse to pulse until the number of cycles approaches c1. Similarly, each square represents a data point for the Iread of a memory element after a reset voltage is applied. Recall that the reset state is a high resistance state, so that Iread should be relatively low if the reset state is achieved. Again, in the training period of c1 cycles, Iread can vary erratically from pulse to pulse until the number of cycles approaches c1.

In the training period, the memory elements can act erratically. For example, a set pulse may cause a memory element to go to the reset state, and a reset pulse may cause a memory element to go to the set state. However, the training pulses are applied blindly, independently of how the memory elements react to each pulse. In contrast, other approaches might apply one reset pulse, determine that the memory element has not been reset, and, in response, apply another reset pulse until the memory element is reset. Strictly applying a predetermined training waveform delays any verify operations until it is expected that the memory elements have reached a stable period in which their behavior is predictable. Each training pulse can be about 3-100 nanoseconds, for instance, which is insignificant compared to the forming time.

Referring again to FIG. 7, step 708 includes performing set and reset processes with a verify operation and evaluating the performance of the memory devices, in a post-training evaluation process. The post-training set process can use the same set voltage level used during the training period, in one approach. Similarly, the post-training reset process can use the same reset voltage level used during the training period. Or, different post-training and training levels may be used. A waveform similar to that in FIG. 8C can be used, with the addition of verify operations between the pulses, in the wait periods. The verify operations can be read operations as discussed in connection with FIG. 4. Generally, a few additional cycles of voltage pulses of set and reset processes can be applied to evaluate whether the memory elements are switching properly. This may occur starting at c1 in FIG. 8D. The evaluation essentially verifies the switching behavior of the memory element. The switching behavior is satisfactory when a specified number of resistance-switching memory elements switch to a lower resistance state when the set voltage pulse of each cycle is applied, and to a higher resistance state when the reset voltage pulse of each cycle is applied.

The evaluation can be performed on a subset of memory elements in a set of memory elements, e.g., on at least one non-volatile resistance-switching memory element in the set. Or, the evaluation can be performed on all memory elements in a set. The subset consists of fewer than all memory elements in a set, e.g., as a sample. The evaluation may be assigned a pass status even if some memory elements do not switch properly, e.g., if the erroneous memory elements can be ignored or overcome with error correction techniques.

At decision step 710, if the performance passes the evaluation, the training process ends at step 712. If decision step 710 is false, the memory elements have not yet been sufficiently trained and undergo another pass of training pulses. This is a further training process which applies a number of further cycles of training voltage pulses. To this end, N is set again at step 704, and steps 706 and 708 are performed. N can vary in each pass or be the same. For instance, N may decrease in each pass based on the expectation that a relatively large number of cycles should be applied in the first pass to complete training of most of the memory elements, followed by a smaller number of cycles in the second pass. For instance, the first pass could have one hundred cycles while the second pass has half as many. More than two passes can be performed in this manner until decision step 710 is true.

Moreover, it is also possible to change the voltage levels in each pass. For instance, a higher voltage in absolute value can be used for the set and reset pulses in a later pass than in an earlier pass, based on the theory that more strenuous training is needed. Or, a lower voltage in absolute value can be used for the set and reset pulses in a later pass than in an earlier pass. In another possible approach, the magnitude of the set pulses but not the reset pulses varies between passes, or the magnitude of the reset pulses but not the set pulses varies between passes. In another possible implementation, the set and/or reset pulses vary in magnitude within one pass. For example, the magnitudes may gradually increase with increasing cycles in a pass. Other variations are possible. For instance, not only the voltages can vary, but also the pulse length. In order to get a deeper reset, the reset pulse length can, for instance be increased from 3 ns to 10 ns, or even higher to 20, 50 or 100 ns. At the same time, the set pulse width can also be increased from 3 ns to 10 ns, or even higher to 20, 50 or 100 ns while keeping the voltage constant. The length of a set pulse can differ from the length of a reset pulse.

The training process occurs after the wafer has been fabricated and is almost completed. Generally, before the memory devices are delivered to the customer, they are initialized and tested. Once the product has been qualified it can be shipped.

Figure 9A:
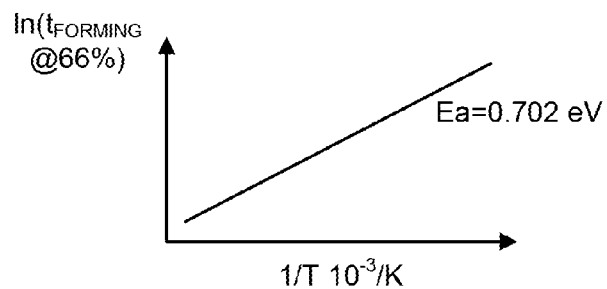
FIG. 9A depicts a logarithmic relationship between forming time and the inverse of temperature.

FIG. 9A depicts a logarithmic relationship between forming time and the inverse of temperature. As mentioned at the outset, increased temperature is correlated with a reduced forming time. Ea is an extracted activation energy of about 0.7 eV. The forming time, $t_{FORMING}$, also referred to as a dielectric breakdown time, is a time period in which the resistance-switching material in a memory element, e.g., the metal-oxide, transitions from a dielectric to a conductor due to the formation of a conductive filament through the material. Specifically, in a resistance-switching memory element, a low resistance state is formed when a conductive filament made up of oxygen vacancies is formed through the memory element. A high resistance state is formed when the conductive filament is broken or otherwise does not extend through the memory element due to oxygen filling the vacancies.

By exposing the memory elements to a heat source, forming time may be decreased. For example, an entire wafer on which many sets of resistance-switching memory elements are formed, can be heated using a heat source at a temperature of at least 50° C., 50 to 150° C., 80° C. to 100° C., 80 to 150° C. or higher. Or, a single die may be heated. Note that the memory elements may or may not reach the temperature of the heat source. When the heat source is initially applied, the temperature of the memory elements will increase to a level which is less than, or substantially at, the temperature of the heat source.

In most case, no special equipment is needed to performing the heating, as the wafer is typically already on a track which can be subject to heat. The heating can occur at a factory during the manufacturing process during die sort or wafer sort or wafer testing, for instance. This is in contrast to simply keeping the wafer at room temperature. Generally, heat is applied to a semiconductor wafer on which the set of non-volatile resistance-switching memory elements is fabricated.

Various techniques for applying heat include heating a pedestal on which a wafer rests, where the heat source is applied to the semiconductor wafer via a surface on which the semiconductor wafer rests. Another approach uses infrared heating. Another approach uses baking in an oven, where the heat source is applied to a set of non-volatile resistance-switching memory elements by baking.

Figure 9B:
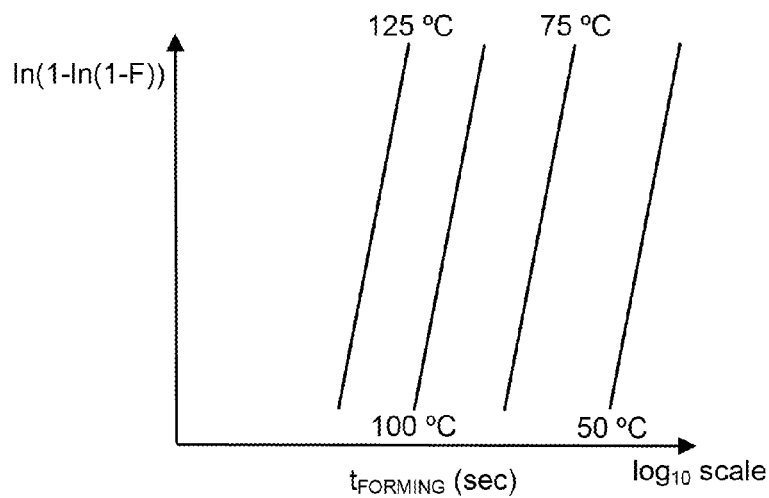
FIG. 9B depicts a cumulative distribution of forming time for different temperatures.

FIG. 9B depicts a cumulative distribution of forming time for different temperatures. The forming time decreases dramatically as temperature is increased, e.g., from 50° C., to 75° C., to 100° C. to 125° C. These distributions are for $HfO_2$ metal-insulator-metal (MIM) capacitors stressed at different temperatures as indicated. This gives evidence that forming time can be reduced by one or more orders of magnitude in a resistance-switching memory element, resulting in significant time savings. For instance, forming time can be decreased by four orders of magnitude by forming at 150° C. instead of 25° C. If the temperature becomes too great, some components such as CMOS components may not work properly. For instance, 200° C. might be an upper limitation. Advantageously, the distribution of the forming time at a given temperature is relatively narrow, so that the forming time of a given set of resistance-switching memory elements can be estimated with some certainty. As a result, the forming process could optionally be performed without monitoring the Iread of the memory elements as in FIG. 8B, as a further benefit. A current mirror which provides current to the memory elements can be adjusted to provide the appropriate current compliance.

To improve device reliability, soft-forming algorithms have been used to stress the memory elements for a relatively long period of time but at a relatively low forming voltage. These algorithms require a significant amount of time such as several hundred milliseconds or even seconds, to complete. Since there are many memory elements, such as several gigabits, the soft-forming process, which is performed separately on different groups of memory elements, can be unduly time consuming. This is in contrast to the faster way to form the memory elements, which is to apply a relatively high voltage for a shorter period of time, but at the risk of damaging the memory elements. Also, the faster way can cause the memory elements to form too strongly, so that an excessive amount of current is needed to reset the memory elements. This amount of current can be more than the diode can deliver. The techniques provided herein can achieve both of the benefits of a fast forming time and improved reliability, since a lower forming voltage can be used. Overall, a softer forming process can be achieved with reduced forming time.

Figure 9C:
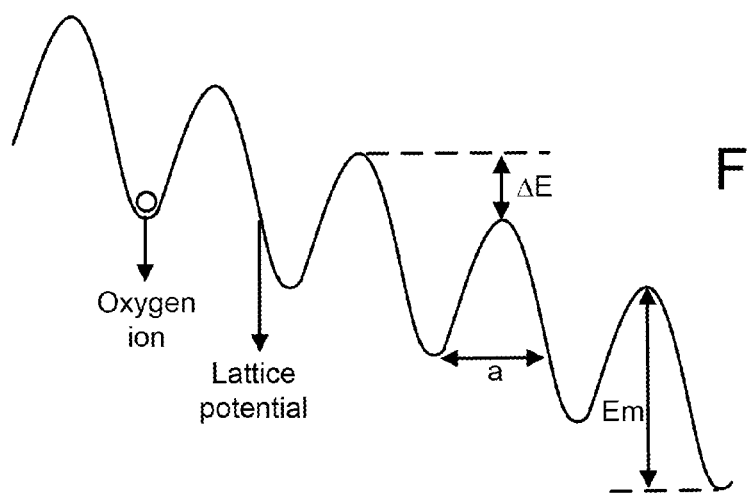
FIG. 9C depicts a schematic view of oxygen ion transport in a lattice of a resistance-switching material.

FIG. 9C depicts a schematic view of oxygen ion transport in a lattice of a resistance-switching material. Energy is indicated by a vertical extent of the diagram while distance is indicated by a horizontal extent of the diagram. For both unipolar and bipolar switching metal oxide memory devices, the set process (the switching from high resistance state to low resistance state) is associated with the migration of the oxygen ions toward the anode and formation of a conductive filament with either oxygen vacancies (Vo) or metal precipitates. Thus, the anode may act as an oxygen reservoir, providing $O^{2-}$ to annihilate Vo or oxidize the metal precipitates during the reset process (the switching from low resistance state to high resistance state). For the bipolar switching reset, it is straightforward to conceive of the drift of $O^{2-}$ from the anode to the bulk oxide to rupture the conductive filament under a reversed bias, as an ionic migration model predicts.

Here, we employ a one dimensional rigid point ion model derived by N. F. Mott. In metal oxides for which this model is valid, $O^{2-}$ hop in the lattice potential is shown in FIG. 9C, where "a" is the hopping distance (~1 nm) and Em is the migration barrier. The diffusion coefficient in such a system obeys the Arrhenius law as $D=D0 \cdot exp(-Em/kT)$, where $D0=\frac{1}{2} \cdot a^2 \cdot f$, f is the attempt-to-escape frequency (~$10^{13}$ Hz) and k is the Boltzmann constant. Em can be extracted from the Arrhenius plot (~0.7 eV). For standard ionic drift with mobility μ, the programming time can be approximated as $L/(\mu E)$, where L is the length of the switching region, and E is the electric field. Without any voltage bias across the device, the device may lose its state because of diffusion, so the retention time can be approximated as $L2/D$, where D is the diffusion constant. Applying the Einstein-Nernst formula ($D=kT\mu/q$), the retention/programming time ratio is $\sim EL\mu/D=qEL/kT$. For typical metal oxide materials, this ratio is not larger than three orders of magnitude assuming room temperature, reasonable bias voltages, and nanoscale L. But considering the high electric field case, retention/programming time ratio can be rewritten as $\sim L/2a \cdot exp(E/E0)$. E0 is typically ~1 MV/cm, which can be achieved in the switching process in oxide thin film.

From this equation, it is clear that we have an exponential increase in diffusion if we apply a higher temperature as well as higher fields. However, as the discharge energy varies with $CV^2$, it is advantageous to only increase the temperature during the burn-in (forming) process.

During the forming process, there are filaments growing in the metal oxide. Some filaments will be only partially formed and some may be fully formed. At least one filament will be fully formed after the forming process. When we perform the training process, this could interrupt a fully developed filament. This is what happens when the memory element switches. We believe that the training process reveals one dominant filament among multiple filaments which are completing. The strongest filament wins while the weaker filaments go away.

Note that the combination of a forming process followed by a training process as provided herein is especially beneficial. Moreover, in some cases, a resistance-switching material may not need forming, but can still benefit from training.

A further possibility is to perform the heating during the training period in a concurrent, combined forming and training process. In this case, we skip a separate forming process and begin cycling the memory device immediately while heating, so that the forming occurs during the training. This would speed up the overall process.

In one aspect, a method for preparing a set of non-volatile resistance-switching memory elements includes applying a heat source at a temperature of at least 50° C. to the set of non-volatile resistance-switching memory elements after each non-volatile resistance-switching memory element in the set of non-volatile resistance-switching memory elements has been fabricated to include a metal oxide layer and first and second electrodes on opposing sides of the metal oxide layer. The method further includes, while applying the heat source, applying at least one forming voltage to at least one non-volatile resistance-switching memory element of the set of non-volatile resistance-switching memory elements via its first and second electrodes to cause the at least one non-volatile resistance-switching memory element to switch from a higher resistance state to a lower resistance state.

In another aspect, a method for preparing a set of non-volatile resistance-switching memory elements includes performing a training process which includes applying multiple cycles of training voltage pulses to at least one non-volatile resistance-switching memory element in a set of non-volatile resistance-switching memory elements, where each cycle includes a set voltage pulse and a reset voltage pulse, and the training process is performed without verifying a switching behavior of the at least one non-volatile resistance-switching memory element. The method further includes, after the training process, applying additional cycles of voltage pulses to the at least one non-volatile resistance-switching memory element, where each additional cycle includes a set voltage pulse followed by an associated verify operation and a reset voltage pulse followed by an associated verify operation.

In another aspect, a method for preparing a set of non-volatile resistance-switching memory elements includes performing a combined forming and training process which includes applying multiple cycles of training voltage pulses to at least one non-volatile resistance-switching memory element in a set of non-volatile resistance-switching memory elements, while applying a heat source at a temperature of at least 50° C. to the set of non-volatile resistance-switching memory elements, where each cycle includes a set voltage pulse and a reset voltage pulse, and the combined forming and training process is performed without verifying a switching behavior of the at least one non-volatile resistance-switching memory element. The method further includes, after the combined forming and training process, applying additional cycles of voltage pulses to the at least one non-volatile resistance-switching memory element, each additional cycle includes a set voltage pulse followed by an associated verify operation and a reset voltage pulse followed by an associated verify operation.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for preparing a set of non-volatile resistance-switching memory elements, comprising:
applying a heat source at a temperature of at least 50° C. to the set of non-volatile resistance-switching memory elements after each non-volatile resistance-switching memory element in the set of non-volatile resistance-switching memory elements has been fabricated each non-volatile resistance-switching memory element comprises a metal oxide layer and first and second electrodes on opposing sides of the metal oxide layer;
while applying the heat source, applying at least one forming voltage to at least one non-volatile resistance-switching memory element of the set of non-volatile resistance-switching memory elements via its first and second electrodes to cause the at least one non-volatile resistance-switching memory element to switch from a higher resistance state to a lower resistance state; and
after the at least one non-volatile resistance-switching memory element switches from the higher resistance state to the lower resistance state, performing a training process.

2. The method of claim 1, wherein:
the heat source is at a temperature of 50° C. to 150° C.

3. The method of claim 1, wherein:
the heat source is at a temperature of 80° C. to 100° C.

4. The method of claim 1, wherein:
the heat source is applied to a semiconductor wafer on which the set of non-volatile resistance-switching memory elements is fabricated.

5. The method of claim 4, wherein:
the heat source is applied to the semiconductor wafer via a surface on which the semiconductor wafer rests.

6. The method of claim 1, wherein:
the heat source is applied to the set of non-volatile resistance-switching memory elements by baking.

7. The method of claim 1, wherein:
the at least one forming voltage causes the at least one non-volatile resistance-switching memory element to switch from the higher resistance state to the lower resistance state for a first time.

8. The method of claim 1, wherein:
the performing the training process comprises applying a plurality of cycles of training voltage pulses to the at least one non-volatile resistance-switching memory element, each cycle includes a set voltage pulse and a reset voltage pulse, and the training process is performed without verifying a switching behavior of the at least one non-volatile resistance-switching memory element.

9. A method for preparing a set of non-volatile resistance-switching memory elements, comprising:
performing a training process which includes applying a plurality of cycles of training voltage pulses to at least one non-volatile resistance-switching memory element in a set of non-volatile resistance-switching memory elements, each cycle includes a set voltage pulse and a reset voltage pulse, and the training process is performed without verifying a switching behavior of the at least one non-volatile resistance-switching memory element; and
after the training process, applying additional cycles of voltage pulses to the at least one non-volatile resistance-switching memory element, each additional cycle includes a set voltage pulse followed by an associated verify operation and a reset voltage pulse followed by an associated verify operation.

10. The method of claim 9, further comprising:
determining whether a switching behavior of the at least one non-volatile resistance-switching memory element is satisfactory when the additional cycles are applied; and
if the switching behavior is not satisfactory, performing a further training process which includes applying a plurality of further cycles of training voltage pulses to the at least one non-volatile resistance-switching memory element, each further cycle includes a set voltage pulse and a reset voltage pulse, and the further training process is performed without verifying the switching behavior of the at least one non-volatile resistance-switching memory element.

11. The method of claim 10, wherein:
the switching behavior is satisfactory when the at least one non-volatile resistance-switching memory element switches to a lower resistance state when the set voltage pulse of each additional cycle is applied, and the at least one non-volatile resistance-switching memory element switches to a higher resistance state when the reset voltage pulse of each additional cycle is applied.

12. The method of claim 10, wherein:
the set voltage pulses in the additional cycles of voltage pulses differ in amplitude from the set voltage pulses in the further cycles of training voltage pulses.

13. The method of claim 9, wherein:
the plurality of cycles of training voltage pulses includes at least 10 cycles.

14. The method of claim 9, further comprising:
before the training process, applying at least one forming voltage to at least one non-volatile resistance-switching memory element in the set to cause the at least one non-volatile resistance-switching memory element to switch from a higher resistance state to a lower resistance state for a first time.

15. A method for preparing a set of non-volatile resistance-switching memory elements, comprising:
performing a combined forming and training process which includes applying a plurality of cycles of training voltage pulses to at least one non-volatile resistance-switching memory element in a set of non-volatile resistance-switching memory elements, while applying a heat source at a temperature of at least 50° C. to the set of non-volatile resistance-switching memory elements, where each cycle includes a set voltage pulse and a reset voltage pulse, and the combined forming and training process is performed without verifying a switching behavior of the at least one non-volatile resistance-switching memory element; and
after the combined forming and training process, applying additional cycles of voltage pulses to the at least one non-volatile resistance-switching memory element, each additional cycle includes a set voltage pulse followed by an associated verify operation and a reset voltage pulse followed by an associated verify operation.

16. The method of claim 15, further comprising:
determining whether a switching behavior of the at least one non-volatile resistance-switching memory element is satisfactory by determining whether the at least one non-volatile resistance-switching memory element switches to a lower resistance state when the set voltage pulse of each additional cycle is applied, and by determining whether the at least one non-volatile resistance-switching memory element switches to a higher resistance state when the reset voltage pulse of each additional cycle is applied; and
if the switching behavior is not satisfactory, applying a plurality of further cycles of training voltage pulses to the at least one non-volatile resistance-switching memory element, each further cycle includes a set voltage pulse and a reset voltage pulse, and the further training process is performed without verifying the switching behavior of the at least one non-volatile resistance-switching memory element.

17. The method of claim 15, wherein:
the heat source is applied after each non-volatile resistance-switching memory element in the set of non-volatile resistance-switching memory elements has been fabricated to include a metal oxide layer and first and second electrodes on opposing sides of the metal oxide layer, and the plurality of cycles of training voltage pulses are applied to the at least one non-volatile resistance-switching memory element via its first and second electrodes.

18. The method of claim 15, wherein:
the plurality of cycles of training voltage pulses includes at least 10 cycles.

19. The method of claim 15, wherein:
the combined forming and training process causes the at least one non-volatile resistance-switching memory element to switch from a higher resistance state to a lower resistance state for a first time.

20. The method of claim 15, wherein:
the heat source is at a temperature of 50° C. to 150° C.

* * * * *